United States Patent [19]

Metcalf et al.

[11] 4,220,491
[45] Sep. 2, 1980

[54] METHOD FOR FORMING AN ACCURATELY ASSEMBLED LAMINATE UTILIZING A VACUUM HOLDING PRESS

[75] Inventors: Gerald S. Metcalf, Lower Burrell; Paul J. Kovacik, Ford City, both of Pa.

[73] Assignee: PPG Industries, Inc., Pittsburgh, Pa.

[21] Appl. No.: 952,912

[22] Filed: Oct. 19, 1978

Related U.S. Application Data

[63] Continuation of Ser. No. 822,185, Aug. 5, 1977, abandoned.

[51] Int. Cl.² .............................................. B29C 17/00
[52] U.S. Cl. .................................... 156/285; 29/464; 156/556; 156/580
[58] Field of Search ............... 156/285, 299, 580, 497, 156/556, 583.6; 269/21, 58, 75; 29/464; 100/233

[56] References Cited

U.S. PATENT DOCUMENTS

| | | | |
|---|---|---|---|
| 2,969,299 | 1/1961 | Fullerton et al. | 148/131 |
| 3,299,502 | 1/1967 | Wanesky | 29/464 |
| 3,453,957 | 7/1969 | Hamilton | 101/269 |
| 3,711,081 | 1/1973 | Cachon | 269/21 |
| 3,741,116 | 6/1973 | Green et al. | 269/21 |
| 3,897,294 | 7/1975 | MacTurk | 156/285 |
| 3,957,371 | 5/1976 | Rich | 355/74 |
| 3,982,979 | 9/1976 | Hentz et al. | 156/285 |
| 4,006,909 | 2/1977 | Ollendorf et al. | 156/285 |
| 4,032,387 | 6/1977 | Ebina et al. | 156/580 |

Primary Examiner—Jerome W. Massie
Attorney, Agent, or Firm—Dennis G. Millman

[57] ABSTRACT

Two sheets are brought into accurately controlled registry with one another to form a laminate by indexing and retaining each sheet on a separate vacuum platen and then bringing the platens together along a fixed locus.

3 Claims, 4 Drawing Figures

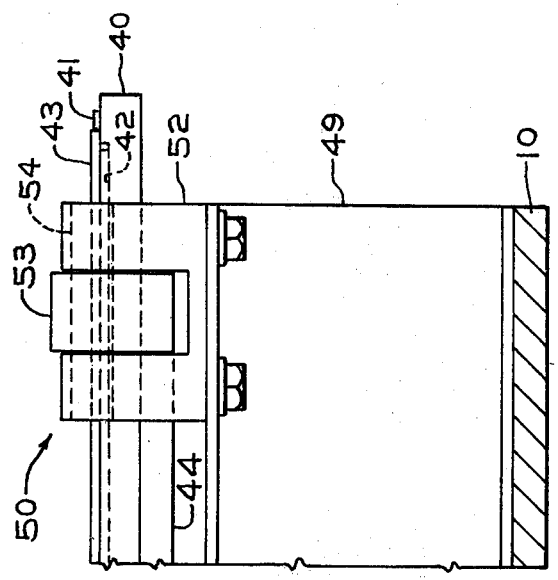
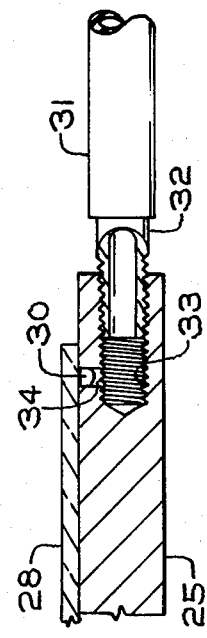
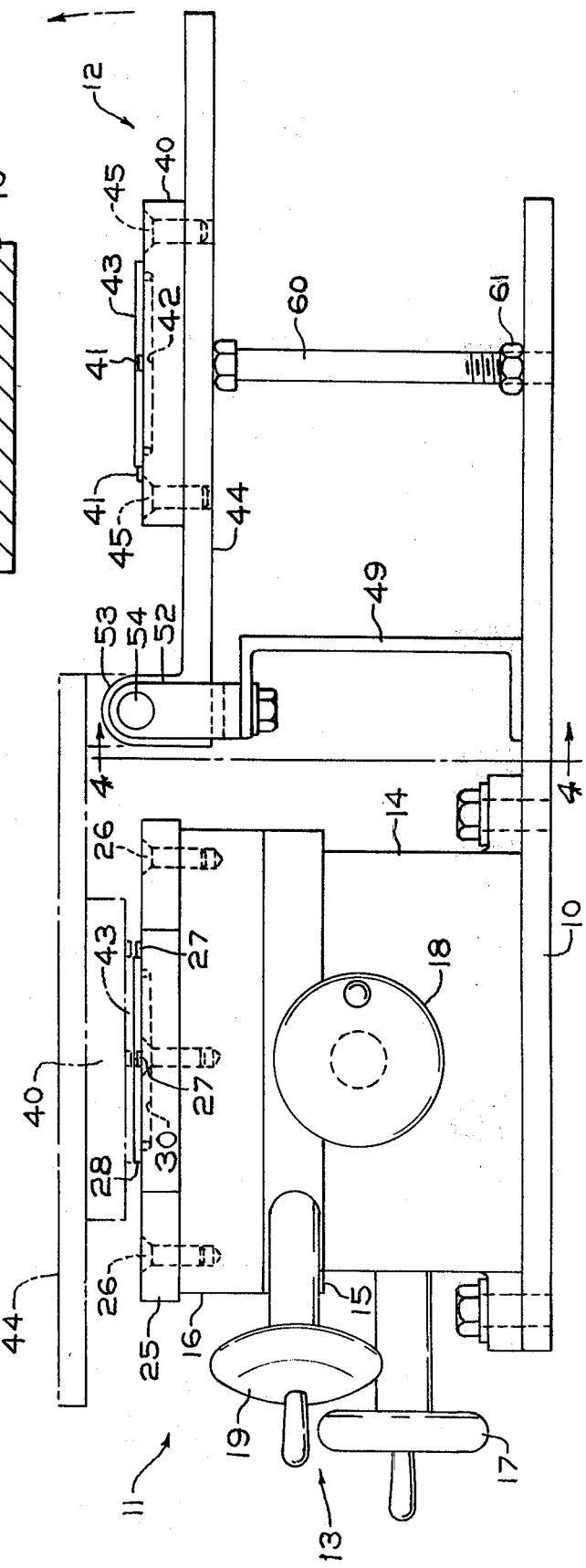

METHOD FOR FORMING AN ACCURATELY ASSEMBLED LAMINATE UTILIZING A VACUUM HOLDING PRESS

This is a continuation of application Ser. No. 822,185, filed Aug. 5, 1977, now abandoned.

BACKGROUND OF THE INVENTION

This invention relates to a method and apparatus for applying one sheet of material onto another to form an adhesively bonded laminate. More specifically, the invention relates to improvements in such a process and apparatus which enable the placement of one sheet onto the other sheet to be carried out repeatedly with a high degree of accuracy. The improvements achieved by the present invention may be beneficial to a wide range of fabricating processes involving the application of a sheet onto a substrate in an accurately reproducible manner.

One area in which accurate alignment of plies which are to form a laminate is particularly important is the assembly of electrical devices wherein proper circuit formation requires very close tolerances in the positioning of the plies. Examples of such devices are the touch control and digital display panels used in domestic appliances and the like. It is advantageous to employ these panels in place of buttons, knobs, dials, and other conventional controls because such a panel can include a multiplicity of controls on a single sheet of glass which presents a smooth, easily cleanable surface. Such panels are typically comprised of a sheet of glass having baked enamel designs on at least one side and a patterned electro-conductive coating on the back side, to which connections are made to the control circuitry of the appliance. To avoid electrical shock hazard to the appliance user in the event of glass breakage, the panel is commonly provided with a barrier sheet of plastic adhered to the back side of the glass panel. In order to accommodate the required circuitry connections, the plastic film must have openings which are aligned with the appropriate connection points on the back side of the panel. The location of these holes relative to the electroconductive coating pattern on the glass often must be carried out to within very small tolerances, for example, ±0.030 inch (±0.76 millimeters). Moreover, the presence of adhesive on one of the plies renders manual assembly difficult because lateral sliding of the plies is usually precluded after the initial contact. This problem is particularly acute when pressure sensitive adhesives are used, as is preferred.

Heretofore, it was known to employ work holders to retain work pieces in fixed positions while a variety of operations were performed thereon, but nothing in the prior art suggests a solution of the particular problem encountered here. U.S. Pat. No. 3,453,957 to Hamilton shows a vacuum table for holding a sheet of material while a series of holes is punched into the sheet and then a printing plate is pressed onto the sheet to impress a pattern in fixed relationship to the punched holes. U.S. Pat. No. 3,957,317 to Rich discloses a hinged printing mask within which a circuit board may be retained while being exposed on both sides for photographic development. U.S. Pat. No. 3,741,116 to Green et al. relates to a printing process in which the sheet material is retained under the printing plate by means of a vacuum table. Other uses of vacuum means for retaining work pieces are shown in the following U.S. Pat. Nos. 2,969,299 to Fullerton et al. 3,897,294 to MacTurk, 4,006,909 to Ollendorf et al. None of the above-cited references deals with accurate joining of two plies to form a laminate as in the present invention.

SUMMARY OF THE INVENTION

The present invention brings two plies together in accurate alignment with one another by the use of two sheet-receiving platens which are linked together so as to be moved along a fixed locus between an open, sheet loading position and a closed, sheet applying position in which the platens are juxtaposed in close face-to-face relationship. Each platen includes indexing means which precisely establishes the position of each sheet on the respective platen. Each platen also includes vacuum means for retaining the sheet in place after it has been positioned. The side of a sheet which carries an adhesive coating is placed face up on one platen. With a pair of sheets retained in place on the platens by vacuum, the platens are brought into the closed position, thereby bringing the sheets into contact with one another at a precisely predetermined relative position to one another and adhering the sheets together by way of the adhesive coating so as to form a laminate. The vacuum may then be released, the platens opened, and the laminate unloaded.

THE DRAWINGS

FIG. 1 is a side view of a preferred embodiment of the present invention with the platens in the opened position.

FIG. 3 is an enlarged, fragmentary, cross-sectional view taken along lines 3—3 in FIG. 2 showing details of the vacuum connection.

FIG. 4 is a view taken along lines 4—4 in FIG. 1 showing hinge details.

DETAILED DESCRIPTION

Figure 2:
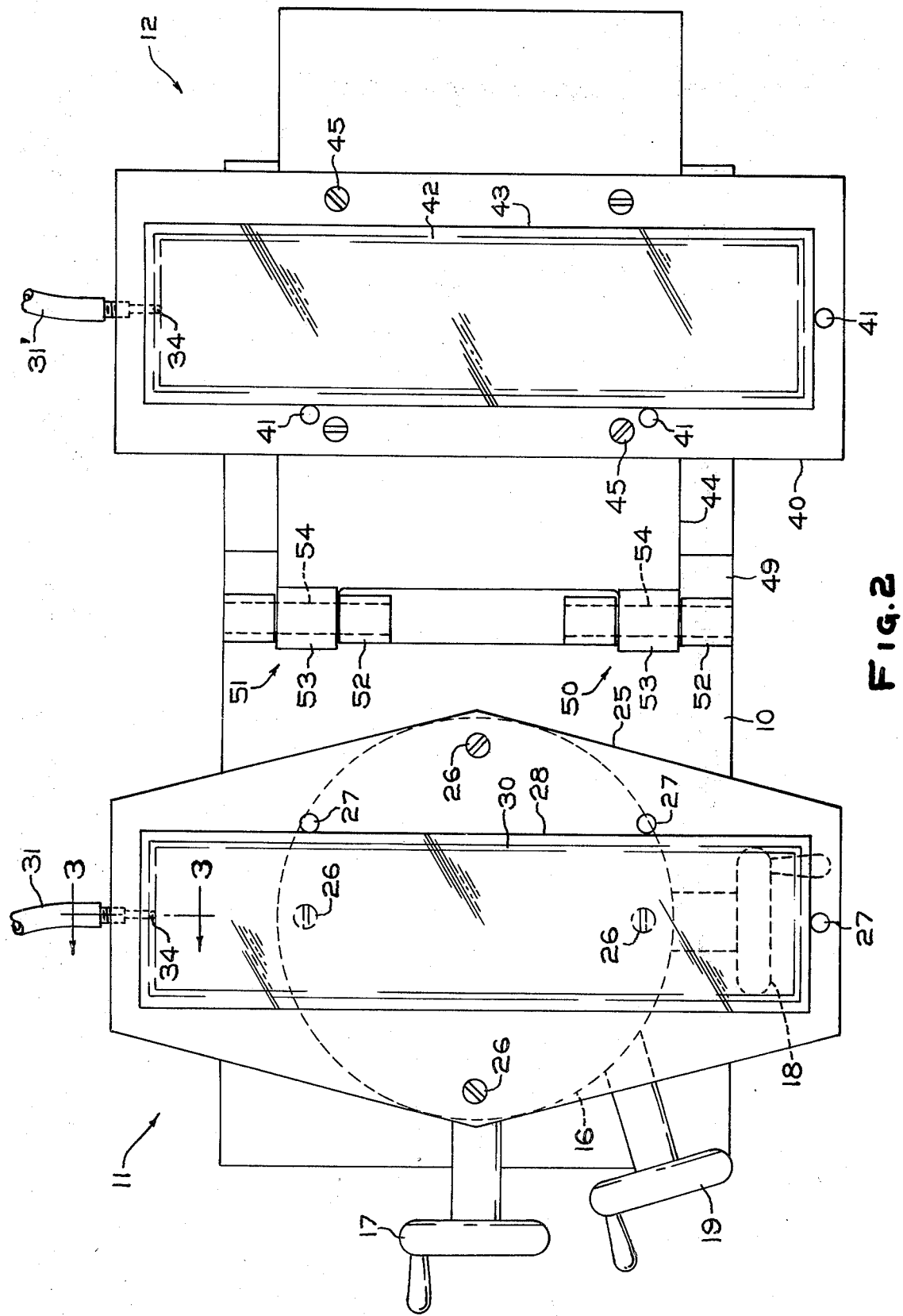
FIG. 2 is a plan view of the same apparatus shown in FIG. 1.

The detailed description of the preferred embodiment will be made in connection with a process of applying a thin plastic film onto a glass touch control panel wherein the plastic sheet carries a pressure sensitive adhesive. It should be apparent, however, that the invention is not limited to the particular types of sheet materials being assembled.

Referring now to FIGS. 1 and 2, there is shown a specific, preferred embodiment of an aligning-laminating device in accordance with the present invention. The apparatus is provided with a rigid, unitary base 10 to which are affixed a stationary platen section 11 and a pivoting platen section 12. Stationary section 11 includes an indexing table 13 which is bolted to base 10. The indexing table includes a bed 14 which carries a pair of sliding platforms 15 and 16. The platforms may be horizontally translated by means of cranks 17 and 18, respectively, and rotated within a horizontal plane by means of a crank 19.

Affixed to the top of the indexing table is a first platen 25 whose upper surface is a smooth, generally horizontal plane. Attachment of platen 25 to the indexing table 13 is preferably by means such as screws 26 which permit the platen to be readily interchanged with other platens having different shapes corresponding to different shapes of laminates being produced. The position of platen 25 may be finely adjusted by means of the indexing table 13. Projecting above the surface of platen 25 to a height slightly less than the thickness of the sheet material being laminated are a number of indexing pins 27. When a sheet such as glass sheet 28 is placed onto platen 25, sliding the sheet into edge contact with the pins 27 properly positions the sheet on the platen. In cases where a very thin sheet is being laminated, difficulty in establishing the proper height for the indexing pins may make it preferable to use spring loaded indexing pins. Such pins are biased upwardly by springs recessed below the sheet-receiving surface of the platen, so that the pins may project above the upper surface of a sheet placed onto the platen, but because of their resilient mounting will not interfere with closing the platens.

A vacuum groove 30 is cut into the upper surface of platen 28 and lies within an area covered by sheet 28 when properly butted against the indexing pins. A tube 31 communicates the vacuum groove with a vacuum pump (not shown). Details of the connection between the tube 31 and the vacuum groove 30 are shown in FIG. 3. Tube 31 fits over a nipple 32 which is threaded into a bore 33 in the side of platen 25. Groove 30 communicates with the threaded bore 33 by means of a small vertical cross-bore 34. In the figures, the vacuum groove 30 is shown as having a generally rectangular shape closely adjacent to the edges of sheet 28. It should be understood that vacuum groove 30 could be provided with other patterns, although the arrangement shown has been found to be particularly advantageous in that the peripheral arrangement avoids the circuit holes in the sheet, particularly the plastic sheet. Instead of a continuous groove, the vacuum means could take the form of a large number of holes or a porous pad communicating with a vacuum plenum within the platen, especially if the sheet has no holes as would usually be the case with the glass sheet.

Directing attention now to the other platen section 12, there is provided a second platen 40 which is in essence the same as the first platen 25 and is likewise provided with indexing pins 41 and a vacuum groove 42. Connection to a vacuum tube 31' is made in the same manner as in the first platen shown in FIG. 3. A second sheet 43, which is to form one of the plies of the laminate, is shown aligned on platen 40 in abutment with aligning pins 41. Sheet 43 may be a plastic sheet material such as "MYLAR" (a trademark of E.I. duPont de Nemours and Co., Wilmington, Del. for polyethylene glycol terephthalate). In the preferred operation, the plastic film is coated with a pressure sensitive adhesive on one side and the adhesive coated side is placed face up on platen 40. Examples of suitable adhesives are "3M 918" and "3M 468." Platen 40 is detachably fastened to a pivot plate 44 by means of screws 45, for example, in order to facilitate interchanging the platen for platens of other configurations.

Pivot plate 44 is pivotally attached to a bracket 49 extending upwardly from base 10 by means of a pair of hinges 50 and 51. An additional view of one of the hinges is shown in FIG. 4. Each hinge includes a bifurcated yoke member 52 bolted to bracket 49 and a tongue 53 formed by an upward extension of pivot plate 44. Yoke 52 and tongue 53 each include axially aligned bores for receiving a horizontally disposed hinge pin 54. The axis of rotation defined by hinges 50 and 51 lies midway between glass sheet 28 and plastic sheet 43 in their respective aligned positions and at the intersection of the planes of the upper surfaces of glass sheet 28 and plastic sheet 43. The hinge permits pivot plate 44, along with platen 40 and sheet 43, to be pivoted from the open, essentially horizontal position shown in FIGS. 1 and 2 through a 180° arc to a closed position as shown in phantom lines in FIG. 1, wherein the opposing surfaces of the glass sheet 28 and plastic sheet 43 are brought into parallel, face-to-face contact and become adhered together in accurate, predetermined alignment with one another. The alignment is originally established by adjusting indexing table 13 so that platen 25 and platen 40 come together with the desired registry. Once the alignment has been established, the apparatus may be used to produce a large number of laminates, each having its plies in identical, accurately determined relationship to one another. In the example illustrated in the drawings, equal sized sheets 28 and 43 are brought together with their opposed surfaces in contact with one another across their full extent.

In order to hold pivot plate 44 and platen 40 in a generally horizontal position for loading, stop means, such as a bolt 60, may be provided. Bolt 60 is threaded into a nut 61, which in turn is welded to base 10, whereby pivot place 44 rests loosely on the head of bolt 60.

A typical operational sequence of the present invention entails first placing a sheet of glass 28 onto platen 25 and sliding it into abutment with all three indexing pins 27 and then activating vacuum means to pull a vacuum through tube 31 and groove 30, thereby locking the glass sheet 28 in place. Likewise, a sheet of plastic 43 is placed onto platen 40, adhesive side up, and slid laterally into contact with three indexing pins 41. Examples of commonly used sheet thicknesses are $\frac{1}{8}$ inch (3.2 millimeters) for the glass sheet and 0.010 inch (0.25 millimeters) for the plastic sheet plus adhesive. The plastic sheet alone may be about 0.007 inch (0.18 millimeters). Vacuum is then applied through tube 31' and groove 42 so as to retain the plastic sheet 43 in place. A vacuum pressure of about −25 to −28 psig has been found to leave an ample margin of safety. The pivoting platen section 12 on which the plastic sheet is being held is then pivoted through a 180° arc to bring the sheets into contact with one another and to adhere them together by means of the pressure sensitive adhesive carried by the plastic sheet. The vacuum is then released from both platens and the pivoting section is returned to its original open position. The adhered sheets are then removed from platen 25 and are then preferably passed between pressure rolls (not shown) in order to assure firm adhesion between the sheets.

It should be understood that while the preferred embodiment illustrated employs as advantageously simple hinge arrangement for bringing the platens together, many alternative arrangements are possible within the scope of the present invention. For example, rather than one pivoting section and one stationary section, both platens could be pivoted into a closed position. Furthermore, a variety of means could be employed to lift and invert one platen and then superimpose it upon the other platen, in which an arcuare path need not be followed so long as guide means are provided for bringing the platens together in fixed, predetermined alignment with one another. Other variations and modifications within the spirit and scope of the present invention will be apparent to those of skill in the art.

We claim:

1. A method of laminating a pair of sheets having substantially equal areas and at least one of which is a thin plastic film, comprising the steps of:

bringing a first sheet of thin plastic film to rest loosely in a random orientation on an upwardly facing first planar surface of a first platen with substantially the entire area of the film in contact with and supported by the first planar surface, sliding the film on the first planar surface into edge contact with abutment means on the first platen projecting above the first surface so as to locate the film on the first platen in a predetermined position, and then drawing a vacuum through an opening in the first surface to retain the film in said predetermined position;

bringing a second sheet to rest loosely in a random orientation on an upwardly facing second planar surface of a second platen, sliding the second sheet on the second surface into edge contact with abutment means on the second platen projecting above the second surface so as to locate the second sheet on the second platen in a predetermined position, and then drawing a vacuum through an opening in the second surface to retain the second sheet in said predetermined position;

retaining the first and second platens in mechanically fixed relationship to each other as at least one of the platens is pivoted and said first and second planar surfaces are brought from an upwardly facing orientation to a parallel, face-to-face close adjacency to one another, with the first and second sheets pressed together therebetween in accurate, predetermined registry to each other, and thereby adhering the sheets together by means of a layer of adhesive interposed between the sheets;

releasing the vacuum from both platens, separating the platens, and unloading the laminated composite formed by the adhered sheets.

2. The method of claim 1 wherein the first and second sheets carry features which are brought into accurately determined alignment with one another in said adhering step.

3. The method of claim 2 wherein said second sheet is glass.

* * * * *